HIGH FREQUENCY POWER TRANSISTOR HAVING CROSSING INPUT AND OUTPUT LEADS

Filed Nov. 29, 1968 2 Sheets-Sheet 1

INVENTOR.
ANTONIUS H. HILBERS

BY

Frank R. Trifari

AGENT

INVENTOR.
ANTONIUS H. HILBERS
BY
[signature]
AGENT

United States Patent Office 3,555,375

Patented Jan. 12, 1971

3,555,375

HIGH FREQUENCY POWER TRANSISTOR HAVING CROSSING INPUT AND OUTPUT LEADS

Antonius Hubertus Hilbers, Emmasingel, Eindhoven, Netherlands, assignor, by mesne assignments, to U.S. Philips Corporation, New York N.Y., a corporation of Delaware Filed Nov. 29, 1968, Ser. No. 780,085
Claims priority, application Netherlands, Dec. 22, 1967, 6717634
Int. Cl. H01l *1/02, 1/14*
U.S. Cl. 317—235 9 Claims

ABSTRACT OF THE DISCLOSURE

A high frequency transistor is described having input, output and common leads. In order to reduce the undesired feedback effect of a stray series inductance in the common lead, the output leads are arranged so as to cross one another in such close proximity as to inductively couple them together providing a feedback opposite to that of the stray inductance in order to compensate the latter.

Figure 1:
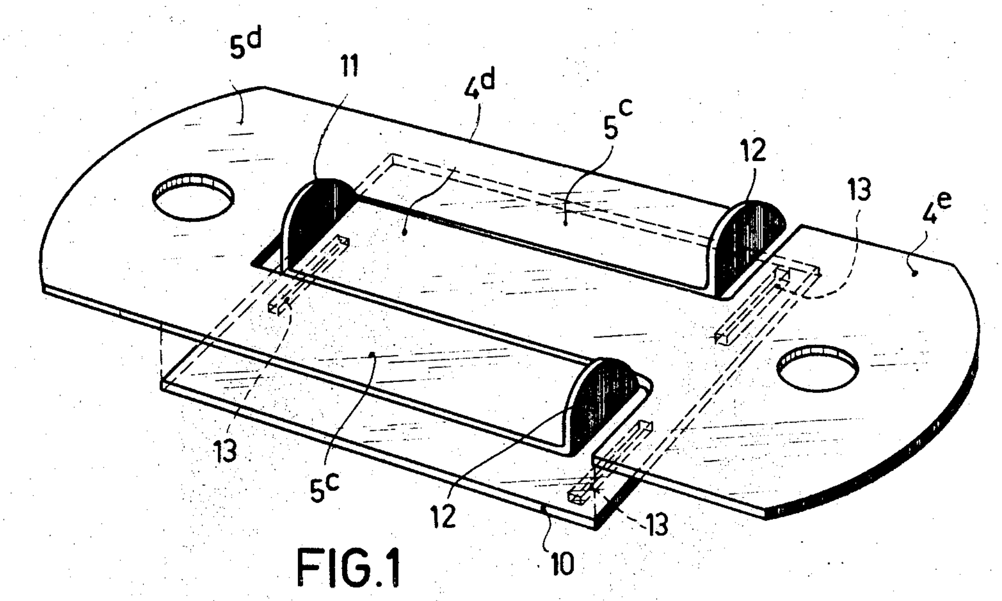

The invention relates to a semiconductor device for amplifying electric signals comprising a semiconductor body which is provided with an input electrode, an output electrode, and a third electrode, hereinafter termed common electrode, which is destined to form part of an input circuit together with the input electrode and to form part of an output circuit together with the ouput electrode, said three electrodes being each provided with at least one connection conductor or lead-in conductor.

The invention furthermore relates to a circuit arrangement comprising such a semiconductor device.

As is known, the possible amplification which can be reached with such devices in circuit arrangements is often adversely influenced by internal stray impedances of the device which caused undesired coupling between the electric input and output. In this respect are of importance, for example, series inductances of the connection conductors of the device, especially also when the circuit arrangement is meant to handle signals of high power and/or signals of high frequency.

Particularly annoying is the effective induction of the common connection conductor as well as the effective induction of the common electrode. This induction in the common part of the input circuit and of the output circuit causes feedback coupling between the electric input and the electric output of the device, so that the possible amplification can be adversely influenced. For example, in a transistor in common emitter arrangement, the possible amplification will be reduced by it while in common base arrangement the amplification can become so large by it that the circuit arrangement becomes unstable.

It is to be noted that in this connection the term electrode is to be understood to have a very wide meaning so that it includes not only a conductive contact with a semiconductor region but also said relative semiconductor region. The term connection conductor also should be understood to have a very wide meaning so that in addition to connection pins and filamentary conductors, it is to be understood to include, for example, conductive tracks which are provided on an insulating substrate. The term connection conductor is generally understood to include any conductive connection which, without the interposition of active or passive electric circuit elements, is connected to the conductive contact of one of the electrodes.

It will be obvious that it is of importance that the series inductance of the common part of the input circuit and the output circuit is kept small. An important contribution to this inductance originates from the usually thin wires which are used in semiconductor devices, for example, transistors, as connections between electrodes of the semiconductor body and connection pins of an envelope. It has therefore been proposed already to keep these wires as short as possible and moreover to connect the common electrodes to a metal base plate of the envelope. This is done to make the connection between the common electrode and a point in the circuit with reference potential, usually earth, as short as possible, and with the lowest possible inductance. Furthermore the geometric cross-section of the wires may be chosen as favourable as possible, for example, with the largest possible diameter, or several parallel wires may be used.

Although the inductance of the connection conductor can be reduced in this manner, it has been found in practice, that the influence of the remaining inductance of the connection conductor can still be very annoying while in addition the influence of the effective inductance of the common electrode is not changed in this manner. Moreover, it is not desirable in all circumstances that the common electrode is connected to the housing or the base plate of the envelope.

The invention is inter alia based on the recognition of the fact that the existing drawbacks can only be mitigated and the disadvantageous effect of the inductance of the common part of the input circuit and the output circuit can be removed in an effective manner by choosing a suitable configuration for the connection conductors.

According to the invention, a semiconductor device of the type mentioned in the preamble is characterized in that, in order to compensate for at least a part of the effective inductance of the common electrode and of the connection conductor connected thereto, the connection conductors of the input electrode and of the output electrode extend at least over part of their length in the immediate proximity of each other and, viewed from the semiconductor body, in opposite directions.

By thus providing the connection conductors of the input electrode and the output electrode in the proximity of each other, a magnetic coupling is formed between the conductors by mutual induction which is directed so that the influence of the inductance of the common part of the input circuit and the output circuit is compensated for.

Since the impedance of the mutual induction occurring as a result of the coupling between the input and the output and that of the inductance of the common part of the input circuit and the output circuit are correspondingly frequency-dependent, the provided coupling is highly frequency-independent so that devices according to the invention show a higher possible amplification in a wide frequency band.

It is to be noted that the use of the invention may cause the series inductance of the connection conductors of the input electrode and of the output electrode to be increased. Generally this will only be a small increase while in addition in the further circuit arrangement said series inductance may usually be taken into account in a simple manner. For example, when in the further circuit inductances are used as circuit elements, the said series inductances may be considered part of that circuit element. Moreover, the said inductances may be tuned out by means of capacitors in the further circuit.

In semiconductor devices, for example, transistors, in which the semiconductor body is arranged within an envelope and in which the connection conductors are passed through the wall of the envelope, the invention may advantageously be used within the envelope and such a device is characterized in that the parts of the two connection conductors which extend in the immediate proximity of each other and in opposite directions are arranged inside the envelope.

Such an envelope may be, for example, an embedding of a synthetic resin, the wall of the envelope being understood to mean the surface of the synthetic envelope.

In this manner a semiconductor device with an incorporated compensation is obtained which enables in a circuit a higher energy amplification than a comparable semiconductor device in which the invention has not been used.

The parts of the two connection conductors which extend in the immediate proximity of each other and in opposite directions are preferably arranged on an insulating substrate.

As a result of this the distance between the said parts of the two connection conductors is readily fixed so that the coupling provided is little sensitive to mechanical influences.

The substrate may be, for example, an insulating plate on which besides parts of the connection conductors the semiconductor body is also secured.

Furthermore an insulating substrate may be used which bears on further parts of the two connection conductors, said further parts being connected to an insulating support on which the semiconductor body is provided and being furthermore connected to the electrodes of the semiconductor body. The insulating substrate and the invention support preferably extend substantially parallel. It has been found that an important advantage of such an embodiment is that the value of the feedback coupling caused by the provided coupling can simply be adapted to the value of the annoying effective inductance of the relative semiconductor device by increasing or decreasing the distance between the substrate and the support. Furthermore a compact structure is obtained in this manner which is also particularly suitable, for example, for being embedded in a resin.

It is to be noted that the value of the feedback coupling caused by the provided coupling also depends upon the further proportions, for example, the length, the width and the mutual distance of the parts of the connection conductors which extend in the immediate proximity of each other.

Furthermore, the parts of the two connection conductors which extend over the insulating substrate may comprise free ends for the connection of an input circuit and an output circuit and said free ends may project beyond the substrate and an envelope, if any.

The invention is of particular importance for semiconductor devices in which the semiconductor body is that of a transistor.

A circuit arrangement employing a semiconductor device according to the invention is characterized in that electric signals can be supplied to the semiconductor device via the connection conductor of the common electrode and the connection conductor of one of the non-common electrodes, electric signals being derived via the connection conductor of the common electrode and the connection conductor of the other non-common electrode, the coefficient of mutual induction of the connection conductors of the two non-common electrodes being adjusted to a value which is substantially equal to the effective inductance of the common electrode and the connection conductor connected thereto, by means of the extending of the said connection conductors at least over part of the length in the immediate proximity of each other and in opposite directions.

By incorporating the semiconductor device in a circuit arrangement in this manner, the use of the invention may actually be profitable and further the proportioning described usually gives the best results. The admissible value of the coefficient of mutual induction is also determined by the requirement that the semiconductor device must be stable. For example, in a transistor in common emitter arrangement in which the effective inductance of the emitter results in a negative feedback coupling and the magnetic coupling provided between the base and the collector results in positive feedback coupling, the coefficient of mutual induction may not be larger than the effective inductance unless a negative feedback coupling is present in a different manner between the base and the collector, for example, by stray capacitive coupling. In fact, due to the required stability the total feedback coupling may in no case result in positive feedback coupling.

Although feedback coupling other than of an inductive nature may be compensated for by using the invention, it is generally recommendable to avoid such a compensation as much as possible because otherwise the compensation to be provided is dependent on the load impedance as a result of which instability may occur upon variation of the load impedance. Therefore the coefficient of mutual induction is preferably made substantially equal to the effective inductance to be compensated for.

Figure 2:
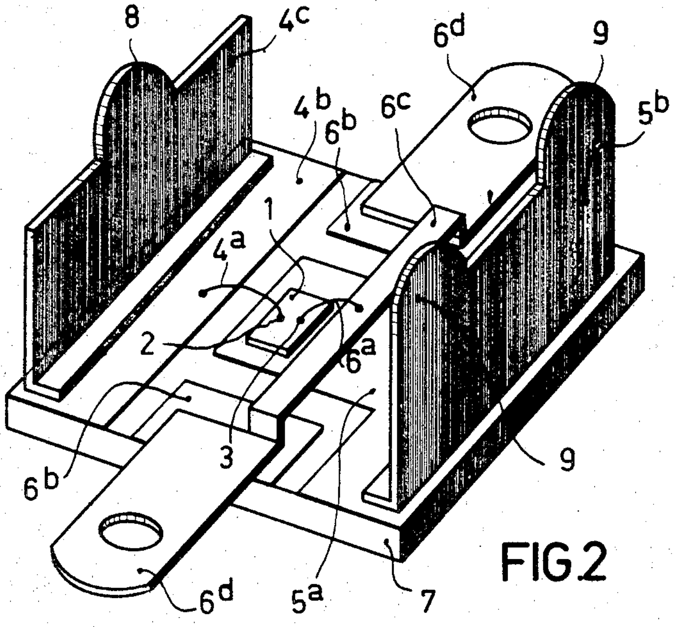

In order that the invention may be readily carried into effect, a few examples thereof will now be described in greater detail, with reference to the accompanying drawings, in which FIG. 1 diagrammatically shows a part of an example of a semiconductor device according to the invention, of which example FIG. 2 diagrammatically shows another part.

Figure 4:
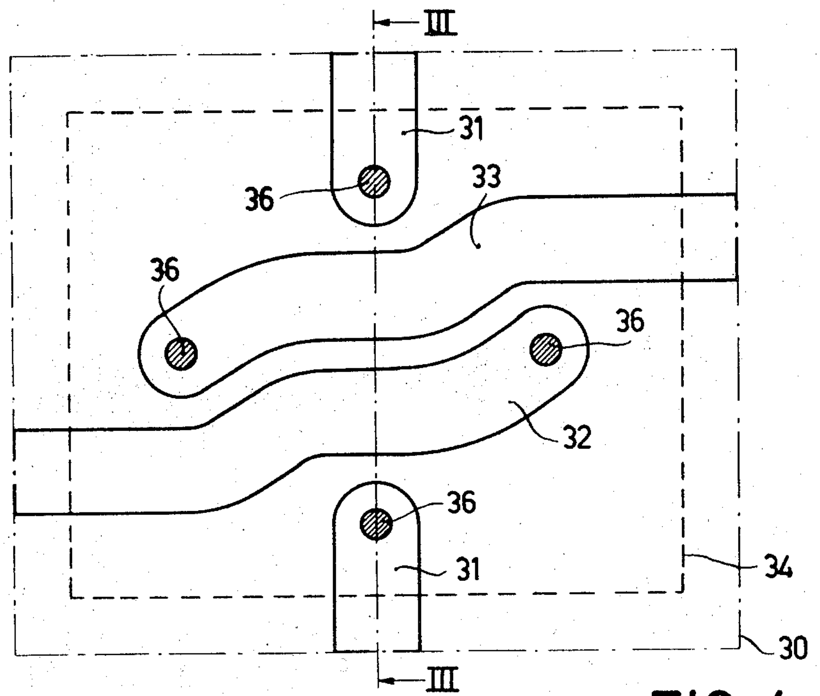
Figure 3:
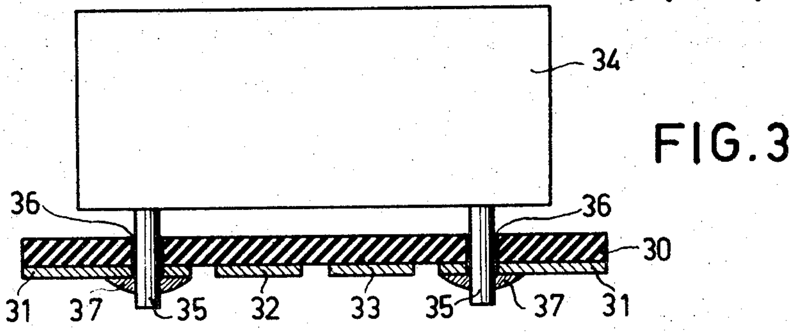
Figure 5:
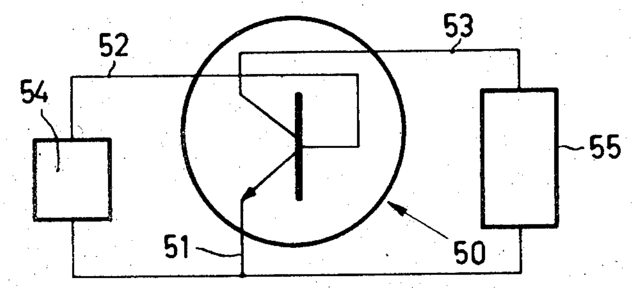

FIG. 3 diagrammatically shows a part-cross-sectional view of another example of a semiconductor device according to the invention, while FIG. 4 diagrammatically shows an underneath view of the part which is shown as a cross-section in FIG. 3, FIG. 5 diagrammatically shows an example of a circuit arrangement according to the invention.

The semiconductor device shown in FIGS. 1 and 2 comprises a semiconductor body 1, dimensions approximately 1 mm. x 1 mm. x 0.2 mm., which is provided with an input electrode 2, an output electrode, in the present example the lower side of the semiconductor body 1, and a common electrode 3 which is destined to form part of an input circuit together with the input electrode 2, and to form part of an output circuit together with the output electrode, said three electrodes being each provided with at least one connection conductor, denoted in FIGS. 1 and 2 by 4, 5 and 6, respectively.

The semiconductor body 1 which may be manufactured entirely in the conventional manner may be that, for example, of a transistor in which the input electrode 2 is the base (or the emitter) of the transistor, the output electrode being constituted by the collector of the transistor. In this example the emitter (or the base) of the transistor forms the common electrode 3.

According to the invention the connection conductors 4 and 5 of the input electrode 2 and the output electrode extend over a part $4^d$, and $5^c$, respectively (FIG. 1) of their length in the immediate proximity of each other and, viewed from the semiconductor body 1, in opposite directions. As a result of this at least a part of the effective inductance of the common electrode 3 and the connection conductor 6 connected thereto is compensated for.

The parts $4^d$ and $5^c$ extend over and are secured in a conventional manner to an insulating substrate 10, for example, of mica, dimensions approximately 11 mm. x 9 mm. x 0.1 mm. Furthermore these parts $4^d$ and $5^c$ are provided at one end with upright lugs 11 and 12, respectively, while at the other end they terminate in free extremities $4^e$ and $5^d$, respectively, which serve for the connection of an input circuit and an output circuit, respectively, and which project beyond the substrate.

The insulating substrate 10 which for clearness sake is shown separately in FIG. 1 is provided with holes through which the lugs 8 and 9 extend when the substrate 10 bears on the further parts $4^c$ and $5^b$ of the connection conductors 4 and 5. The substrate 10 and the base plate 7 extend substantially parallel to each other. The lugs 8 and 11 as well as the lugs 9 and 12, may be secured together by spot-welding or by soldering. In a slightly altered embodiment the lugs 11 and 12 are lacking and the lugs 8 and 9 are bent above the substrate 10 and are secured to the parts $4^d$ and $5^c$.

The parts $4^c$ and $5^b$ are secured to an insulating base plate 7 on which the semiconductor body 1 is provided. Via the metal tracks $4^b$ and $5^a$ and the wire $4^a$ they are connected to the input electrode 2 and the output electrode of the semiconductor body 1.

The insulating base plate 7 consists for example of beryllium oxide and may have dimensions of approximately 8 mm. x 6 mm. x 1.3 mm. Conductive tracks $4^b$, $5^a$ and $6^b$, for example, of gold, are provided in any conventional manner on said substrate.

The further parts $4^c$, $5^b$ and $6^d$ are secured to the conductive tracks $4^b$, $5^a$ and $6^b$, for example, by soldering. The parts $6^d$ may be interconnected by a bridge $6^c$.

Furthermore the semiconductor body 1 is connected to the conductive track $5^a$ in any conventional manner, for example, by alloying, while the input electrode 2 and the common electrode 3 of the semiconductor body 1 are connected to the conductive track $4^b$ and the bridge $6^c$ by means of wires $4^a$ and $6^a$, respectively, for example of gold or aluminum, having a diameter of approximately 100 $\mu$m.

The parts $4^{c, d, e}$ $5^{b, c, d}$ and $6^{c, d}$ may be manufactured for example, of copper, approximately 0.4 mm. thickness. The width of the parts $4^{c, e}$, $5^{b, d}$ and $6^d$ is, for example, approximately 6 mm. and the heights of the parts $4^c$ and $5^b$ may be approximately 4 mm.

It is to be noted that the value of the provided feedback coupling has been found to be dependent also on the height of the parts $4^c$ and $5^b$, the value of the feedback coupling increasing with the increase of the height. So the feedback coupling is larger according as the distance between the base plate 7 and the substrate 10 is larger or, in other words, according as the surface which is enclosed by the two half loops constituted by the parts $4^{a, b, c, d}$ and $5^{a, b, c}$ respectively, is larger.

The envelope of the device may be manufactured in any conventional manner and is not shown to avoid complexity of the drawing. For example, the base plate 7 is secured to a metal plate having dimensions of approximately 14 mm. x 14 mm. x 2 mm., while the assembly may be embedded in a resin to form a block of dimensions of approximately 14 mm. x 14 mm. x 10 mm. The parts $4^d$ and $5^c$ are located inside the envelope and the supply conductors 4, 5 and 6 are passed through the wall of the envelope via the parts $4^e$, $5^d$ and $6^d$ projecting from the envelope.

In the following example (FIGS. 3 and 4) the invention is used outside the envelope of the relevant semiconductor device. FIG. 3 shows a normal semiconductor device, diagrammatically denoted by the block 34, with connection pins 35. This semiconductor device, for example, a transistor, is mounted on an insulating substrate or support 30, a part of which is shown in cross-section. A pattern of printed wiring is provided on the substrate 30 of which the conductive tracks 31, 32 and 33 form part. A few holes 36 for connecting the transistor 34 are provided in the tracks 31, 32 and 33 and the substrate 30. The connection pins 35 of this transistor project through the holes 36 and are then secured, for example, by soldering, connections 37 being formed between the connection pins 35 and the conductive tracks 31, 32 and 33.

FIG. 4 shows an underneath view of a part of the insulating substrate 30, in which the place of the transistor is diagrammatically denoted by the broken line 34 corresponding to the circumference of the transistor, whereas the connection pins 35 and the connections 37 are not shown to avoid complexity of the drawing. Two of the four connection pins 35 of the transistor are connected to the conductive tracks 31. These conductive tracks together with the relative connection pins form part of the connection conductors which connect the adjacent circuit elements of the circuit arrangements to the common electrode, for example, the emitter electrode of the transistor. The two remaining connection pins are connected to the conductive tracks 32 and 33 which hence form part of the connection conductors of the input electrode, for example, the base electrode, and the output electrode, for example, the collector electrode respectively.

According to the invention the connection conductors of the input electrode and the output electrode extend at least over a part 32 and 33, respectively, of their length in the immediate proximity of each other and, viewed from the semiconductor body, in opposite directions. Said parts 32 and 33 extend over the insulating substrate 30.

FIG. 5 shows a circuit arrangement according to the invention employing a transistor 50 in common emitter arrangement. The parts of the circuit arrangement which are of no significance for the invention are shown diagrammatically by the blocks 54 and 55. Through the connection conductor 51 of the common electrode (the emitter) and the connection conductor 52 of one of the non-common electrodes (the base), electric signals are applied to the transistor while through the connection conductor 51 and the connection conductor 53 (the collector) electric signals are derived. The coefficient of mutual induction of the connection conductors 52 and 53 of the two non-common electrodes is adjusted to a value which is substantially equal to the effective inductance of the common electrode and the connection conductor 51 connected thereto, by means of the extending of the said connection conductors 52 and 53 over part of their length in the immediate proximity of each other and in opposite directions.

With a circuit arrangement according to the invention a considerably higher power amplification can be realized in a wide frequency band. The coefficient of mutual induction is chosen to be so that the increase of the power amplification over a wide frequency range is as large as possible while the possibility of instability of the circuit arrangement is small.

It has been observed that such a circuit arrangement which otherwise was composed in the conventional manner and in which a transistor was included which, without using the invention, with an output power of 12 watt and a frequency of 175 mc./s., supplies a power amplification of 5.4 db, by using the invention an improvement of the power amplification to 7.9 db was obtained under otherwise the same circumstances. The coefficient of induction of the supply conductors 52 and 53 was approximately 1.1 nh.

It will be obvious that the invention is not restricted to the examples described and that many variations are possible to those skilled in the art without departing from the scope of this invention. For example, the invention may also be of importance for transistors which are destined for use in common collector circuits, while the invention may furthermore be used, for example, in field effect transistors in which the gate electrode may or may not be insulated. In addition to a plate the insulating substrate may be, for example, an insulating layer which is provided, for example on a semiconductor body of an integrated circuit. Furthermore other materials, for example, nickel or aluminium, and/or other forms, for example, a filamentary form, may be chosen for the connection conductors. The magnetic coupling may be realised, for example, in a single manner by suitably bending the connection pins of the semiconductor device in which case the connection pins may be bent inside or outside the envelope.

What is claimed is:

1. A semiconductor device comprising a semiconductor body having an input electrode, an output electrode, and a common electrode adapted during operation to form part of an input circuit with the input electrode and part of an output circuit with the output electrode, input connection conductor means connected to the input electrode, output connection conductor means connected to the output electrode, and common connection conductor means connected to the common electrode and jointly exhibiting during operation in the circuit an effective inductance causing undesired coupling between the input and output, and means for compensating for at least a substantial part of the said effective inductance of the common part of the circuit, said compensation means including means for mounting of the input and output conductor means in such manner that at least over a part of their length they extend in opposite directions measured from their point of connection electrically nearer to their associated electrode and are substantially parallel and in such close proximity to each other over said part as to inductively couple them together to provide a mutual inductance effecting during operation the desired compensation.

2. A semiconductor device as set forth in claim 1 wherein an envelope is provided which houses the semiconductor body, the connection conductors pass through the envelope wall, and the said close proximity parts of the input and output connection conductor means are located within the envelope.

3. A semiconductor device as set forth in claim 1 wherein the said mounting means comprises an insulating substrate.

4. A semiconductor device as set forth in claim 3 wherein an insulating support is provided, the semiconductor body and portions of the connection conductors are mounted on the insulating support, and the insulating substrate is mounted on portions of the input and output connection conductors mounted on the insulating support.

5. A semiconductor device as set forth in claim 4 wherein the insulating substrate and insulating support extend substantially in parallel.

6. A semiconductor device as set forth in claim 5 wherein the common connection conductor comprises a free end projecting beyond the insulating support, and the input and output connection conductors each comprise free ends projecting beyond the insulating substrate in different directions.

7. A semiconductor device as set forth in claim 5 wherein the support mounted portions of the input and output connection conductors comprise vertical upstanding parts, and the substrate mounted portions of the input and output connection conductors comprise horizontally extending interdigitated members.

8. A semiconductor device as set forth in claim 1 wherein an envelope is provided which houses the semiconductor body, the connection conductors pass through the envelope wall, and the said close proximity parts of the input and output connection conductor means are located externally of the envelope.

9. An amplifying circuit arrangement comprising a semiconductor device as set forth in claim 1 and including means for applying input signals between the input and common connection conductors, and means for deriving output signals between the output and common connection conductors, the extent of coupling between the input and output connection conductors being such as to provide a mutual inductance which is substantially equal to the said effective inductance of the common part of the circuit.

References Cited

UNITED STATES PATENTS

| | | | |
|---|---|---|---|
| 2,721,965 | 10/1955 | Hall | 317—234 |
| 3,277,232 | 10/1966 | Ragan | 317—234 |
| 3,387,190 | 6/1968 | Winkler | 317—234 |

FOREIGN PATENTS

| | | | |
|---|---|---|---|
| 1,104,029 | 6/1955 | France | 317—234 |
| 1,179,195 | 5/1959 | France | 317—234 |

JERRY D. CRAIG, Primary Examiner

U.S. Cl. X.R.

307—299; 317—234